(12) United States Patent
Lawrence et al.

(10) Patent No.: US 12,129,549 B2
(45) Date of Patent: Oct. 29, 2024

(54) PLASMA-ENHANCED CHEMICAL VAPOR DEPOSITION COATING SYSTEM

(71) Applicant: HZO, Inc., Morrisville, NC (US)

(72) Inventors: Benjamin Lawrence, Salt Lake City, UT (US); Daniel Pulsipher, Cary, NC (US); Ludmil Zambov, Midland, MI (US); Pravin Chaubey, Morrisville, NC (US); John Winterroth, Apex, NC (US); Attila Nagy, Cary, NC (US)

( * ) Notice: Subject to any disclaimer, the term of this patent is extended or adjusted under 35 U.S.C. 154(b) by 47 days.

(21) Appl. No.: 17/683,334

(22) Filed: Feb. 28, 2022

(65) Prior Publication Data

US 2022/0275509 A1 Sep. 1, 2022

Related U.S. Application Data

(60) Provisional application No. 63/154,037, filed on Feb. 26, 2021.

(51) Int. Cl.
C23C 16/54 (2006.01)
C23C 16/455 (2006.01)
C23C 16/458 (2006.01)
C23C 16/505 (2006.01)

(52) U.S. Cl.
CPC .... C23C 16/4588 (2013.01); C23C 16/45536 (2013.01); C23C 16/505 (2013.01); C23C 16/54 (2013.01)

(58) Field of Classification Search
None
See application file for complete search history.

(56) References Cited

U.S. PATENT DOCUMENTS

| | | | | |
|---|---|---|---|---|
| 5,037,522 | A * | 8/1991 | Vergason | C23C 14/325 |
| | | | | 204/298.41 |
| 11,732,349 | B2 * | 8/2023 | Shiripov | C23C 14/505 |
| | | | | 118/712 |
| 2006/0086320 | A1 | 4/2006 | Lizenberg et al. | |
| 2011/0097518 | A1 | 4/2011 | Olgado | |
| 2013/0343841 | A1 | 12/2013 | van der Meulen | |
| 2018/0046206 | A1 * | 2/2018 | Nguyen | H01J 37/32 |
| 2019/0338413 | A1 * | 11/2019 | Shiripov | C23C 16/4587 |
| 2019/0338421 | A1 * | 11/2019 | Zong | B05D 3/147 |
| 2020/0083024 | A1 * | 3/2020 | Zong | C23C 16/4584 |

(Continued)

OTHER PUBLICATIONS

Kim "PCT International Search Report for International Application No. PCT/US2022/018231" mailed May 23, 2022, 2 pages.

(Continued)

*Primary Examiner* — Karla A Moore
(74) *Attorney, Agent, or Firm* — Intellectual Strategies

(57) ABSTRACT

A plasma-enhanced chemical vapor deposition coating system includes a deposition chamber including one or more zones of processing, an electrode centrally located within the deposition chamber, wherein the electrode forms a central axis in the deposition chamber, and a carousel configured to carry at least one substrate. The carousel is configured to move axially in a direction along the central axis from a first end of the deposition chamber to a second end of the deposition chamber. The carousel is further configured to rotate around the central axis such that the substrate is oriented in a plurality of different directions relative to the central axis.

13 Claims, 8 Drawing Sheets

(56) References Cited

U.S. PATENT DOCUMENTS

2020/0118793 A1 4/2020 Tudhope et al.
2020/0381275 A1 12/2020 Brezoczky et al.

OTHER PUBLICATIONS

Kim "Written Opinion of the International Searching Authority for International Application No. PCT/US2022/018231" mailed May 23, 2022, 4 pages.

* cited by examiner

PLASMA-ENHANCED CHEMICAL VAPOR DEPOSITION COATING SYSTEM

RELATED APPLICATIONS

This application claims the benefit of U.S. Provisional Patent Application No. 63/154,037, filed Feb. 26, 2021, which is incorporated herein by reference in its entirety

BACKGROUND

This disclosure relates generally to deposition of protective coatings on substrates of electronic devices.

Coating devices for protection from ambient conditions is common in certain industries such as computer electronics. For example, applying a thin coating such as parylene to an electronic component can provide protection from water, dust, and other corrosive substances or harmful conditions. The coating is often done by chemical vapor deposition. The larger a deposition chamber, or in some cases a plasma-enhanced chemical vapor deposition ("PECVD") chamber, the more problems that arise with uniformity for samples treated in different areas of the chamber. Non-uniformity can lead to inconsistent results with too thick a coating in some areas and too thin a coating in other areas. In addition, individual products will have varying quality.

In addition, to uniformity, deposition chambers are often time consuming for loading and unloading while making sure that parts are put in specific areas of the deposition chamber with the hope of providing consistent results after deposition. Many PECVD chambers are operated in a batch mode which can be more labor intensive to operate.

Conformality can also be a problem in high volume coating operations. The faster the deposition occurs, the more directional it becomes. Anisotropic deposition becomes more of a problem when the treatment conditions result in large acceleration of ions in the plasma sheath. As the packing density of parts in a deposition chamber increases, the stacking of the parts could prevent uniform depositions.

SUMMARY

The subject matter of the present application has been developed in response to the present state of the art, and in particular, in response to the problems and disadvantages associated with conventional parylene systems that have not yet been fully solved by currently available techniques. Accordingly, the subject matter of the present application has been developed to provide embodiments of a plasma-enhanced chemical vapor deposition coating system and method that overcome at least some of the shortcomings of prior art techniques.

Embodiments of the present invention address many problems with current coating processes and systems. Some embodiments described herein allow for easier loading of parts into a deposition system. Some embodiments described herein allow for more conformality of deposition. Some embodiments described herein allow for better uniformity.

Some embodiments described herein include an in-line plasma processing equipment. This allows for a streamlined deposition process and leads to easier loading, more conformality, and better uniformity.

Some embodiments described herein include semi-continuous plasma processing equipment. This allows for continuous operation, faster results and more conformality and better uniformity. In addition, lower costs of deposition can lead to simple coatings that are more available to a broader market.

Some embodiments described herein include PECVD equipment capable of uniform, conformal, and reproducible plasma treating in mass production. Some embodiments allow for uniform repeatability in deposition.

Some embodiments described herein utilize a line-of-sight deposition. Conventional mass production systems may utilize line-of-site deposition. When using a more line-of-site plasma system, issues arise with applying a coating underneath components or on the back side of components. Some embodiments allow for deposition on both a front side and a back side of a sample or component. A deposition process that allows for coating all around an entirety of a substrate in a repeatable process reduce or eliminate the need for a second deposition process to coat an opposite side of the substrate.

Some conventional systems, including isotropic plasma systems currently used, primarily utilize a quartz chamber, which is often not feasible for mass production given the throughput requirements. Embodiments described herein allow for a mass production system that produces more isotropic and conformal coatings.

Some embodiments described herein include rotating baskets. In some embodiments, rotation occurs within the deposition chamber and allows for easier loading, more conformality, and better uniformity.

Disclosed herein is a plasma-enhanced chemical vapor deposition coating system. The system includes a deposition chamber including one or more zones of processing, an electrode centrally located within the deposition chamber, wherein the electrode forms a central axis in the deposition chamber, and a carousel configured to carry at least one substrate. The carousel is configured to move axially in a direction along the central axis from a first end of the deposition chamber to a second end of the deposition chamber. The carousel is further configured to rotate around the central axis such that the substrate is oriented in a plurality of different directions relative to the central axis. The preceding subject matter of this paragraph characterizes example 1 of the present disclosure.

The carousel is configured to rotate at least a full three hundred and sixty degrees around the central axis. The preceding subject matter of this paragraph characterizes example 2 of the present disclosure, wherein example 2 also includes the subject matter according to example 1, above.

The carousel is configured to move axially along the central axis at least partially concurrently while the carousel rotates around the central axis. The preceding subject matter of this paragraph characterizes example 3 of the present disclosure, wherein example 3 also includes the subject matter according to any one of examples 1-2, above.

The deposition chamber includes two or more zones of processing positioned along the central axis. The preceding subject matter of this paragraph characterizes example 4 of the present disclosure, wherein example 4 also includes the subject matter according to any one of examples 1-3, above.

A first zone of the two or more zones of processing is a plasma zone, and a second zone of the two or more zones of processing is a post-plasma zone. The preceding subject matter of this paragraph characterizes example 5 of the present disclosure, wherein example 5 also includes the subject matter according to any one of examples 1-4, above.

The system further includes a plasma shield between the first zone of the two or more zones of processing and the second zone of the two or more zones of processing. The preceding subject matter of this paragraph characterizes example 6 of the present disclosure, wherein example 6 also includes the subject matter according to any one of examples 1-5, above.

The carousel includes more than one carrier distributed around the central axis. The preceding subject matter of this paragraph characterizes example 7 of the present disclosure, wherein example 7 also includes the subject matter according to any one of examples 1-6, above.

The carrier is configured to remain oriented vertically with respect to a ground while the carrier rotates around the central axis. The preceding subject matter of this paragraph characterizes example 8 of the present disclosure, wherein example 8 also includes the subject matter according to any one of examples 1-7, above.

The carousel includes a carrier and wherein the carrier is configured to move in a general corkscrew direction around and along the central axis as the carrier moves from the first end to the second end. The preceding subject matter of this paragraph characterizes example 9 of the present disclosure, wherein example 9 also includes the subject matter according to any one of examples 1-8, above.

The electrode is a floating electrode. The preceding subject matter of this paragraph characterizes example 10 of the present disclosure, wherein example 10 also includes the subject matter according to any one of examples 1-9, above.

The system further includes a cylindrical screw drive that mechanically forces the carousel to rotate around the central axis as the carousel moves axially along the central axis. The preceding subject matter of this paragraph characterizes example 11 of the present disclosure, wherein example 11 also includes the subject matter according to any one of examples 1-10, above.

Disclosed herein is a method for plasma-enhanced chemical vapor deposition coating. The method includes moving at least one substrate through a deposition chamber including one or more zones of processing, wherein the substrate is carried by a carousel. The method includes moving the carousel axially in a direction along a central axis of the deposition chamber from a first end of the deposition chamber to a second end of the deposition chamber, wherein the central axis is formed by an electrode. The method includes rotating the carousel around the central axis such that the substrate is oriented in a plurality of different directions relative to the central axis. The preceding subject matter of this paragraph characterizes example 12 of the present disclosure.

The carousel is configured to rotate at least a full three hundred and sixty degrees around the central axis. The preceding subject matter of this paragraph characterizes example 13 of the present disclosure, wherein example 13 also includes the subject matter according to example 12, above.

The carousel is configured to move axially along the central axis at least partially concurrently while the carousel rotates around the central axis. The preceding subject matter of this paragraph characterizes example 14 of the present disclosure, wherein example 14 also includes the subject matter according to any one of examples 12-13, above.

The deposition chamber includes two or more zones of processing. The preceding subject matter of this paragraph characterizes example 15 of the present disclosure, wherein example 15 also includes the subject matter according to any one of examples 12-14, above.

A first zone of the two or more zones of processing is a plasma zone, and a second zone of the two or more zones of processing is a post-plasma zone. The preceding subject matter of this paragraph characterizes example 16 of the present disclosure, wherein example 16 also includes the subject matter according to any one of examples 12-15, above.

The deposition chamber includes a plasma shield between the first zone of the two or more zones of processing and the second zone of the two or more zones of processing. The preceding subject matter of this paragraph characterizes example 17 of the present disclosure, wherein example 17 also includes the subject matter according to any one of examples 12-16, above.

The carousel includes more than one carrier distributed around the central axis. The preceding subject matter of this paragraph characterizes example 18 of the present disclosure, wherein example 18 also includes the subject matter according to any one of examples 12-17, above.

The carrier is configured to remain oriented vertically with respect to a ground while the carrier rotates around the central axis. The preceding subject matter of this paragraph characterizes example 19 of the present disclosure, wherein example 19 also includes the subject matter according to any one of examples 12-18, above.

The carousel includes a carrier and wherein the carrier is configured to move in a general corkscrew direction around and along the central axis as the carrier moves from the first end to the second end. The preceding subject matter of this paragraph characterizes example 20 of the present disclosure, wherein example 20 also includes the subject matter according to any one of examples 12-19, above.

DESCRIPTION OF THE DRAWINGS

In order that the advantages of the subject matter may be more readily understood, a more particular description of the subject matter briefly described above will be rendered by reference to specific embodiments that are illustrated in the appended drawings. Understanding that these drawings depict only typical embodiments of the subject matter and are not therefore to be considered to be limiting of its scope, the subject matter will be described and explained with additional specificity and detail through the use of the drawings, in which.

Throughout the description, similar reference numbers may be used to identify similar elements.

DETAILED DESCRIPTION

Figure 1:
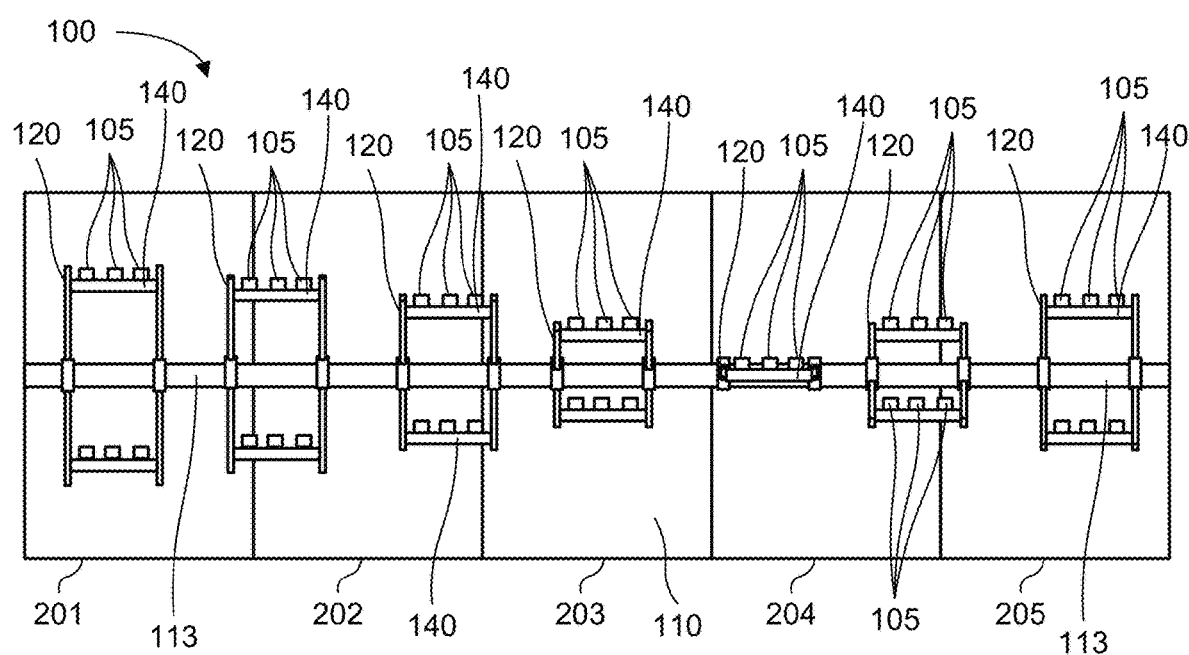
FIG. 1 depicts a schematic diagram of a plasma enhanced chemical vapor deposition coating system according to one or more embodiments of the present disclosure.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

In some embodiments, the term "coating", used herein as a noun includes and is interchangeable with the terms, "treatment", "residue", "film", "lamination", "layer", "veneer", "plating", "overlay", and any other application of one substance or material to another. A "coating" may be made of organic and inorganic materials and specifically includes polymers and other protective coatings. In some embodiments, the term "coating" may refer to a parylene coating.

The expression "configured to" as used herein may be used interchangeably with "suitable for," "having the capacity to," "designed to," "adapted to," "made to," or "capable of" according to a context. The term "configured" does not necessarily mean "specifically designed to" in a hardware level. Instead, the expression "apparatus configured to . . . " may mean that the apparatus is "capable of . . . " along with other devices or parts in a certain context.

The term "selectively coating" or "selectively coated" as used herein throughout with regard to a part, component, device, and the like, means completely or partially coating the part, component, device, and the like. This term also includes completely or partially coating the part, component, device, and the like, and then removing at least a portion of the coating. Additionally, items subjected to a "selective coating" or that have been "selectively coated" have a "selective coating" or a "selective coat." Furthermore, the term "selective coating" has a similar meaning and can similarly be used as a noun or a verb. For purposes of clarification only, a part, component, device, and the like that has been completely or partially coated, and then had at least some of that coating removed through a plasma ashing process or other process has a "selective coat", has been "selectively coated", or has been through the process of "selective coating."

The terms "part", "component", "device", or "item" may be used interchangeably. These terms are meant to include substrates, printed circuit boards and any other item that is or can be coated.

While many embodiments are described herein, at least some of the described embodiments facilitate easier loading, more conformality, and better uniformity. One example of a use case for embodiments of the present invention includes printed circuit boards for electronic devices. These are coated with a polymer or other protective coating. One class of coating material that has proven well suited to chemical vapor deposition on a part such as a printed circuit board is parylene. Parylene offers good waterproof and other protection qualities.

Within this context, improved coating techniques are needed to perform coating of substrates or other parts in and efficient manner, capable of mass processing, and with little waste of material or processing time. Some embodiments of the present invention solve these problems and others by utilizing rotational movement relative to an electrode within a deposition chamber. Some embodiments of the present invention solve these problems and others by utilizing translation movement within the deposition chamber. And some embodiments of the present invention solve these problems and others by utilizing both rotational and translational movement within the deposition chamber.

Some embodiments allow for a 360-degree rotation (see arrow 215 in FIG. 3) about an electrode 113 allowing for coating around an entirety of a substrate 105 or part. Such rotation and movement within a plasma processing system allows for more uniform, conformal, and reproducible coatings. Standard plasma processes sometimes use flat electrodes. Some are more non-isotropic. And some have difficulties with uniformity when being scaled up for large throughput. Some embodiments described herein utilize upright rotating carousels 120 (see generally FIG. 2) in the center of a cylindrical chamber 110 (see generally FIGS. 3-6) to more conformally coat components. The carousels 120 are capable of rotating about a central axis. The rotation of the carousels 120 also accounts for plasma asymmetries in the deposition chamber 110 to produce more uniform and reproducible depositions in large area chambers. The rotation of the parts in the carousels 120 in a radial plasma allows for more conformal coatings to be produced from plasma conditions that result in more directional depositions. The ions will be accelerated radially toward or away from the center electrode 113. As the samples rotate around the center electrode 113, the more directional deposition will have a higher probability of depositing in shadowed or shielded areas.

Some embodiments further allow for a form of masking to occur on the boards. Due to the more conformal nature of the coating apparatus, treated boards, may need an apparatus or clam shell holder to limit deposition is certain areas.

Figure 4:
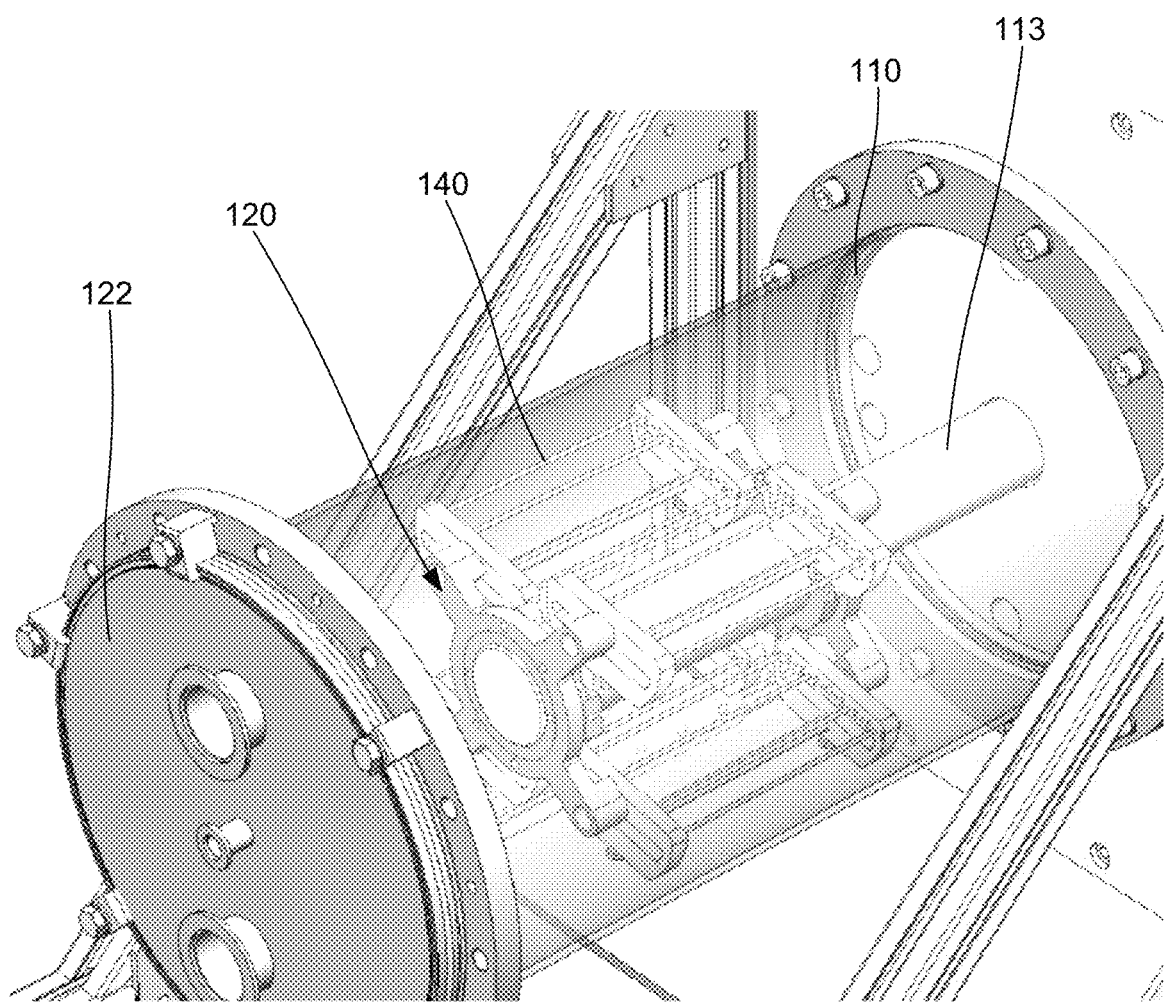
FIG. 4 depicts a perspective view of a carousel for use in a plasma enhanced chemical vapor deposition coating system according to one or more embodiments of the present disclosure.
Figure 5:
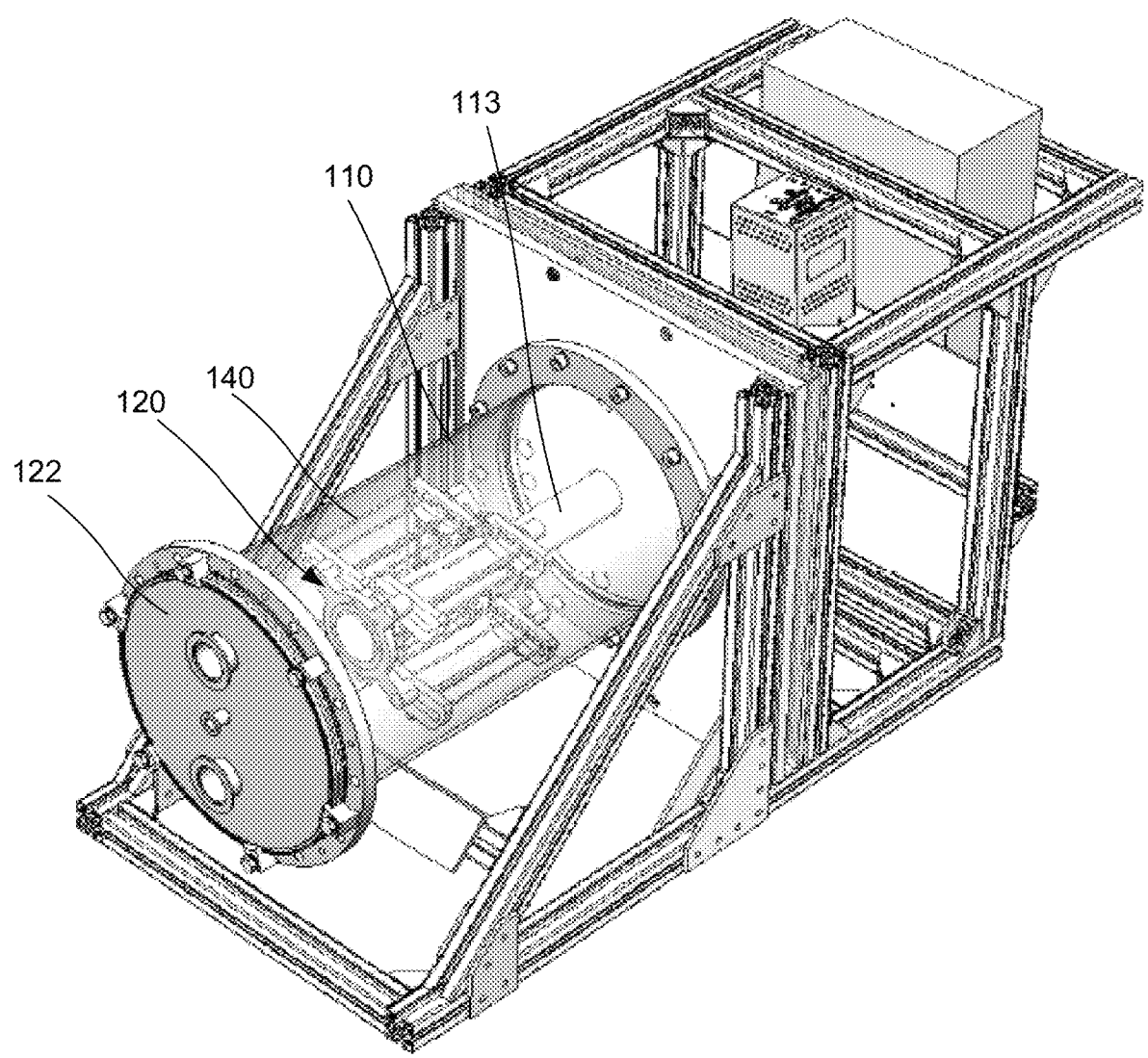
FIG. 5 depicts a perspective view of a carousel for use in a plasma enhanced chemical vapor deposition coating system according to one or more embodiments of the present disclosure.
Figure 6:
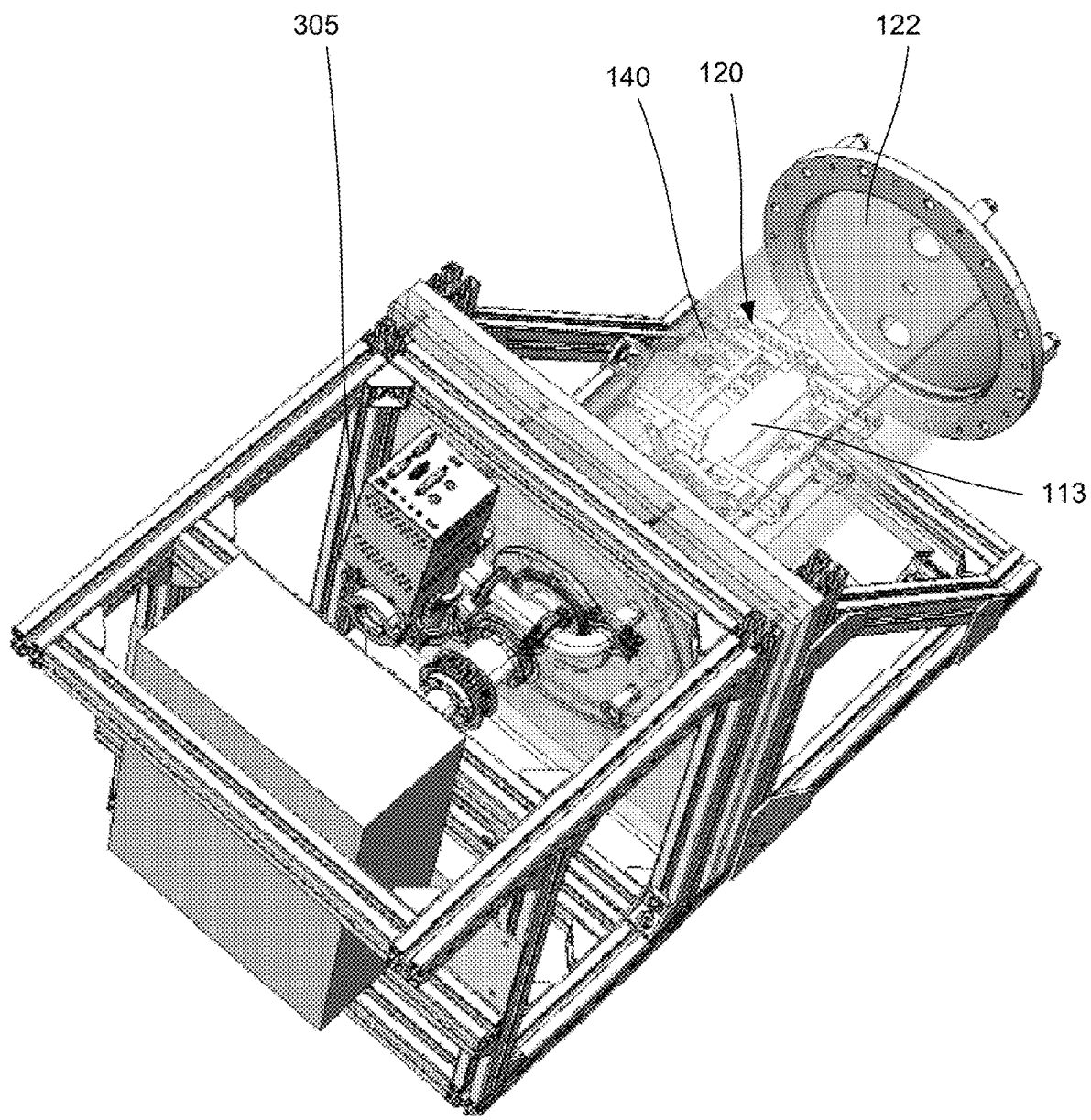
FIG. 6 depicts a perspective view of a carousel for use in a plasma enhanced chemical vapor deposition coating system according to one or more embodiments of the present disclosure.

Some embodiments described herein include a batch system (see generally FIGS. 4-6). In such embodiments, the components or substrates 105 may be manually loaded into the system 100. The system 100 may perform a process is run while the carousels 120 rotate about a central electrode 113. The parts may then be manually removed and the process repeated. The rotation of the carousel(s) 120 allows for a more conformal coating.

Some embodiments described herein include an inline batch system 100 (see generally FIG. 1). In such embodiments, the components or substrates 105 carried by the carousel 120 are translated through distinct zones and allow for both rotational and translational movement within system 100 and within the deposition chamber 110. As parts move through the system 100, components 105 are able to be loaded and unloaded while another batch is under a deposition process. This allows for increased throughput and automation.

Some embodiments described herein include a PECVD system 100 with a cylindrical chamber 110. In some embodiments, the chamber 110 includes a central pivot point or central axis. The components 105 are able to rotate about the central pivot point or central axis. In some embodiments, the components 105 move completely around the central pivot point or central axis in continual rotation about the central pivot point or central axis. In some embodiments, the components 105 move around intermittently allowing the components 105 to reside in a location for a period of time before continuing to rotate.

In some embodiments, the central pivot point may include a central electrode 113 or floating electrode 113. Line of sight deposition may occur from the central or floating electrode 113. The coating would be deposited, in such embodiments, outward or inward in every direction from the central or floating electrode 113. The components would be rotating about the electrode 113 allowing for all sides of the components to face the central or floating electrode 113. In some embodiments, the electrode 113 will extend the length of the deposition chamber 110. In some embodiments, the electrode 113 only forms part of a central shaft that extends the length of the deposition chamber 110. In the illustrated embodiment of FIG. 1, the electrode 113 extends the entirety of the length of the deposition chamber 110.

In some embodiments, the carousels 120 are configured to hold a component 105 in a carrier 140 (sometimes referred to as a basket) such that the component is always in an upright position. As the carrier 140 moves around the electrode 113, the top of the component will face the central or floating electrode 113 when the carrier 140 is at the bottom of the deposition chamber 110 or below the central or floating electrode 113. The bottom of the component will face the central or floating electrode 113 when the carrier 140 is at the top of the deposition chamber 110 or above the central or floating electrode 113. Each side of the component will face the central or floating electrode 113 when the carrier 140 is at each side of the deposition chamber 110. As the component rotates around the central or floating electrode 113 each side of the component will spend time facing the central or floating electrode 113 and thus face the line-of-sight deposition. In some embodiments, the PECVD coating system 100 does not need to be operated in a line-of-sight deposition regime.

In some embodiments, the components are rotating around the central pivot point at the same time they are translating through the cylindrical deposition chamber 110. In some embodiments, the components are translating and rotating. In some embodiments, the components are only rotating. In some embodiments, the components are only translating from one end to the other. In some embodiments, the components can sequentially translate and rotate or rotate and translate in a continual process.

In some embodiments, the central or floating electrode 113 is a stationary pivot point. In some embodiments, the central or floating electrode 113 rotates. In some embodiments, the central or floating electrode 113 may be a stationary pivot point as designed in the inline batch system 100 around which rotating carousels 120 also translate through the system 100.

In some embodiments, the parts rotate in the same plane in the batch system 100. That is, as the carousel 120 translates through the system 100, the individual carriers 140 rotate the components. Stated another way, the carousel 120 may have four carriers 140 (as shown in, for example, FIG. 5). Each of the carriers 140 may stay in a location relative to the central or floating electrode 113. That is, the top carrier 140 may stay above the central or floating electrode 113 the entire time of deposition while the bottom carrier 140 may state below the central or floating electrode 113 the entire time of deposition. Each carrier 140 may be configured to rotate the components such that each side of the component faces the central or floating electrode 113.

In some embodiments, such as the inline batch system 100, as the parts rotate, they are moved through the system 100 translationally. The innovation of moving the parts rotationally and/or translationally through the system 100 allows for all parts to be exposed to the electrode 113 in exactly the same manner or substantially the same manner. As each component moves through the system 100, each component can be exposed to each area in the system 100 so that any low flow areas or high flow areas will occur to all components equally.

In many embodiments, the system 100 is designed to allow the carousels 120 to rotate the baskets while keeping the components in the baskets facing the same upright direction as it rotates around the center. In the illustrated embodiment, the deposition chamber 110 has seven carousels 120 at various stages. The carousels 120 are rotating around the electrode 113 as they translate along the central axis (formed by the electrode 113). So the most left carousel 120 that is fully in zone one 201 includes two carriers 140 that are positioned respectively at the top and bottom of the chamber directly above and below the electrode 113. As the carousel 120 moves along the electrode 113, the carousel 120 will rotate about the central axis.

A second carousel (the second from the left) has moved translationally down the shaft and electrode 113 and has rotated slightly such that the upper carrier 140 has moved in a direction outside the page closer to an observer than the electrode 113. The lower carrier has moved in a direction away from an observer such that it is farther from the observer than electrode 113. The carousel 120 will continue to rotate as it moves translationally along the central axis. The carousel fifth from the left shows the carrier 140 now rotated ninety degrees from the relative position of the first carousel such that the fifth carousel now has the two carriers level with the electrode 113 (one in front of the electrode 113 and one carrier behind the electrode 113).

As can be seen, the components or substrates 105 have not rotated relative to the ground and are still upright. The substrates 105 will, in some embodiments travel all the way around the electrode 113 allowing for the substrates 105 to have each side of the substrate directly face the central axis and the electrode 113.

FIG. 1 is merely an example that is meant to convey such rotation and translation together. While it does not show a complete rotation about the central axis, many embodiments may allow for multiple rotations within the deposition chamber 110 or even multiple rotations in a single zone of the deposition chamber.

In some embodiments, the chamber 110 is made from a conductive material. In some embodiments, the chamber 110 may be constructed of non-conductive materials. When using a conducting chamber 110, the inner surfaces of the chamber 110 may be lined with an electrically insulating material in some embodiments. In some embodiments, the conductive chamber 110 itself is insulated from the central electrode 113 and may act as a ground. In embodiments that utilize a non-conductive chamber 110, external conductive electrodes are sometimes used.

In some embodiments, the asymmetric nature of a cylindrical reactor or a cylindrical chamber 110 with a central electrode 113 allows for denser coatings and faster deposition rates. Denser films will, in turn, lead to a better barrier protection for electronic devices.

In some embodiments, the system 100 includes mass flow controllers (MFCs). In some embodiment, gas or vapor flow is controlled through the MFCs or calibrated leaks. In some embodiments, power is supplied by an RF-plasma generator. In some embodiments, the plasma generator is 13.56 MHz but may also utilize ranges between and including as low as 40 kHz and as high as 2.45 GHz. In some embodiments, dual frequencies are utilized with one a lower frequency and another a higher frequency. For example, in an implementation, 13.56 MHz may be used on one electrode 113 and 100 kHz may be used on another electrode.

Some embodiments include a vacuum pump. The vacuum pump evacuates the chamber 110. In some embodiments, the vacuum pump evacuates the chamber 110 at intervals. In some embodiments, the vacuum pump evacuates the chamber 110 at intervals close enough to limit monomer starvation.

In some embodiments pressure is controlled by a throttle valve or other type of valving system 100. In some embodiments a variable speed pump blower may be used. Pressures used may be between 300 to 800 mTorr, but some embodiments can use a pressure as low as 10 mTorr and/or a pressure as high as 1 Torr. Some embodiments include a foreline trap. In some embodiments, there is a foreline trap before the pump. In some embodiments, there is a foreline trap before the pump to stop oil vapors from backstreaming into the system 100.

The Figures shown are illustrative of some embodiments only. FIG. 1 depicts a schematic diagram of a PECVD coating system 100 according to one or more embodiments of the present disclosure. The illustrated system 100 is generally configured to deposit conformal coatings on a product, part, or component 105. The part 105 may be any type of printed circuit board or other part or component that needs a selective or conformal coating. Although the system 100 is shown and described with certain components, modules and functionality, other embodiments of the system 100 may include fewer or more components or modules to implement less or more functionality.

The illustrated system 100 may include a control processor. The control processor is generally configured to control operations of the system 100, either alone or in conjunction with various processing sub-systems integrated into other systems or modules within the system 100. For example, the control processor might communicate electronically with a plasma module, a coating module, a sensor module, a carrier module, as well as other any other systems or modules included in various embodiments of the system 100.

The control processor also includes software, in some embodiments, stored on any form of computer readable medium and accessible for execution by the control processor. The exact form or format of the software is not constrained other than to be capable of performing the functions described herein and related functions within the scope of similar devices. In particular, the software may be capable of carrying out part or all of the functionality described in any methods, steps, processes, or other functional descriptions of the system 100 and its component sub-systems. In one embodiment, the plasma module is configured to generate plasma.

The illustrated embodiment includes five zones. Other embodiments may include more or less zones, including multiple of any of these five zones. The zones may be separated in some embodiments by gate valves 122 or plasma shields 124 (see FIG. 7, for example). For example, there are gate valves 122 at each end and between zones one and two (201, 202) and between zones four and five (204, 205). A plasma shield 124 (see FIG. 7) separates zone three 203 from zone two 202 and four 204.

In some embodiments, zone one 201 is a loading zone. The zone is configured for loading of components onto carousels 120 or carriers 140 and/or loading of carousels 120 or carriers 140 into the system 100. Zone two 202 is a pre-plasma zone. In some embodiments, the chamber 110 may be a partially filled chamber 110. The pre-plasma zone may be utilized for processes that need to occur before deposition. Zone three 203 is a deposition zone. With the system 100, zone three 203 can be continually full of components limiting downtime of the system 100 as loading in zone one 201 can occur while another batch is in zone three 203. Zone four 204 is a post-plasma zone. Zone four 204 may be utilized for processes that need to occur after deposition. Zone five 205 is an unloading zone and allows for venting. In some embodiments, zones 2 and 4 are slightly higher in pressure than zone three 203 to help confine the plasma to zone three 203. The plasma shields 124 also help to contain the plasma to zone three 203.

In some embodiments, the central or floating electrode 113 is supported by pipes or feeds or insulated supports. Such feeds or insulated supports may be conduits to supply power, gases, and/or water to the central electrode 113.

The system 100 may also include translating systems or translating motor systems 363. Each individual zone may have separate translating motor systems 363 or a translating motor system 363 be used for multiple zones. In some embodiments, the translation (see arrow 216 in FIG. 3) of the carousels 120 through the zones may be the impetus that drives rotation of the carousel 120 around the central or floating electrode 113. This may be seen generally in FIG. 3. As the carousel 120 translates along the central or floating electrode 113, a spiral spine or cylindrical screw drive 180 on the electrode 113 mechanically forces the carousel 120 to rotate around the central or floating electrode 113. Other embodiments may utilize other systems and mechanisms for both translating and for rotating. They may be separate systems or integrated systems. In some embodiments, the individual carriers 140 are rotated instead of the carousel 120.

The system 100 may include an energy source which is configured to provide and apply energy to the gas or gasses supplied by the gas source such that the gas or gasses become at least partially ionized. In one embodiment, the energy source includes direct current. In this embodiment, gas is subjected to an electrical field across the cathode and anode connected by the direct current electric source. In another embodiment, the energy source includes a radio frequency discharge. The energy source may be configured to inductively or capacitively couple energy at a frequency range that is at or below the radio spectrum. The energy source may create an inductively coupled discharge or a capacitively coupled discharge to energize the gas from the gas source. In another embodiment, the energy source includes a microwave discharger or generator. The energy source may apply energy to the gas in a variety of ways including without limitation, with a constant or varying degree of intensity, at a constant or varying rate, or for a constant or varying lengths of time.

The particular application of energy to gas in a particular environment of heat, pressure, or other conditions may allow a user to create a customizable plasma that can be used with a variety of chemical compositions or other characteristics. A customized plasma may be used to create a customizable coating process suitable for a variety of desired coating applications.

Sensors may be utilized and configured to sense or measure any number of factors, including without limitation, a coating depth, a reaction time, a process time, an application time, a gas output, an energy output, an ambient temperature, a material temperature, a pressure, a plasma composition, a material composition, an amount of material, an amount of plasma, a plasma density, an energy level, an energy distribution, a change or shift in any of the forgoing and more. These sensors may include without limitation, optical sensors, particle sensors, spectrometers, thermometers, pressure gages, timing devices, probes, gauges, micrometers, mass analyzers and the like. Sensors may be located along any part of the process.

The system 100 may include a controller. The controller of the sensor module may execute instructions or software to control various aspects or functions of the sensor module. These functions may include, without limitation, sensor function, sensor data input and output, data processing and the like.

Figure 2:
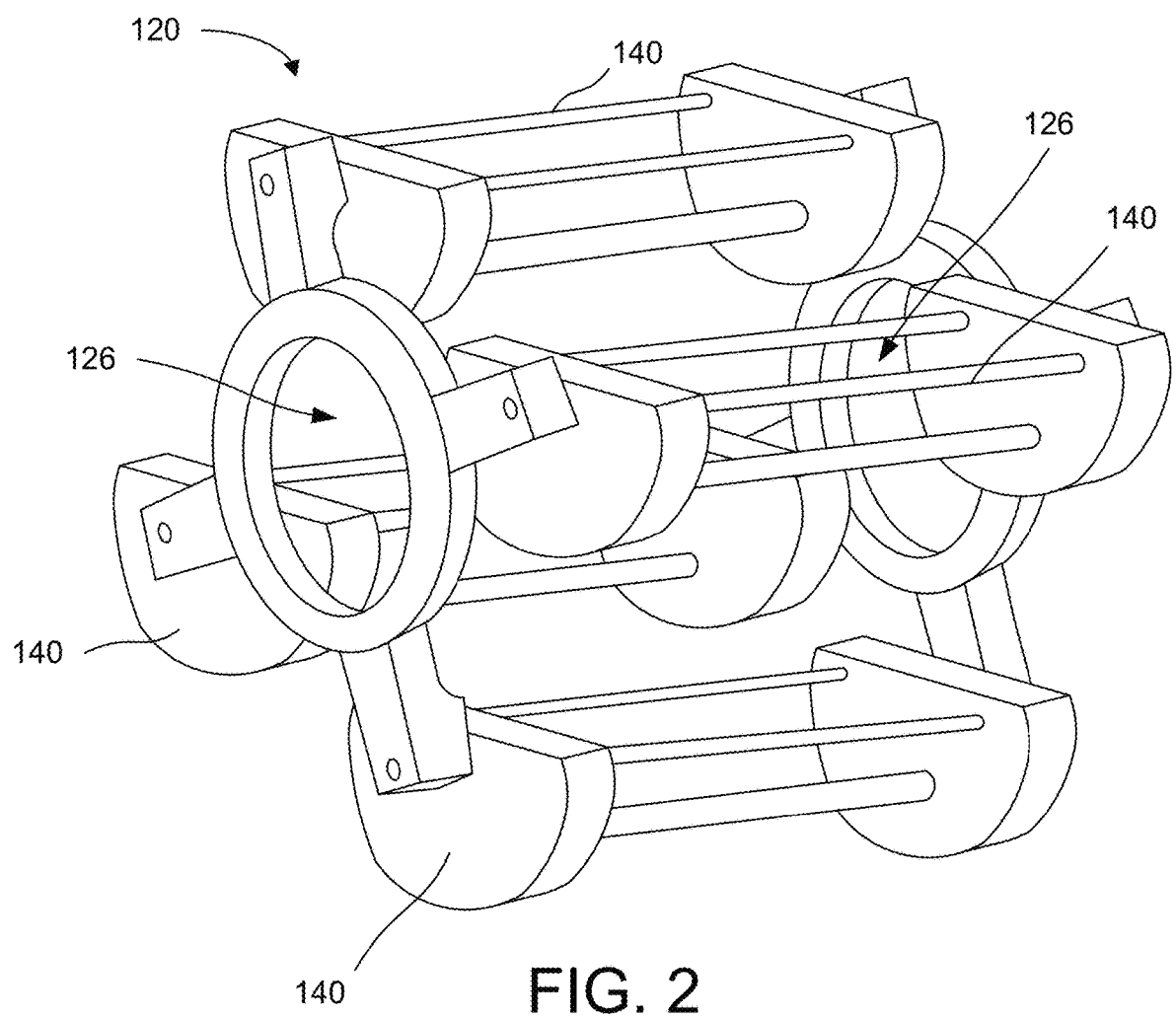
FIG. 2 depicts a perspective view of a carousel for use in a plasma enhanced chemical vapor deposition coating system according to one or more embodiments of the present disclosure.

Turning now to FIG. 2, a perspective view of a carousel 120 is shown. As depicted, the carousel 120 includes four carriers 140 that are positioned around a central opening 126. The opening 126 is configured to fit around the central or floating electrode 113. The carousel 120 may rotate about the central axis. As the carousel 120 rotates, the individual carriers 140 remain upright as they travel around the central axis. In other embodiments the carriers 140 situate the samples in a more vertical position. Other embodiments may utilize rotating carriers.

Figure 3:
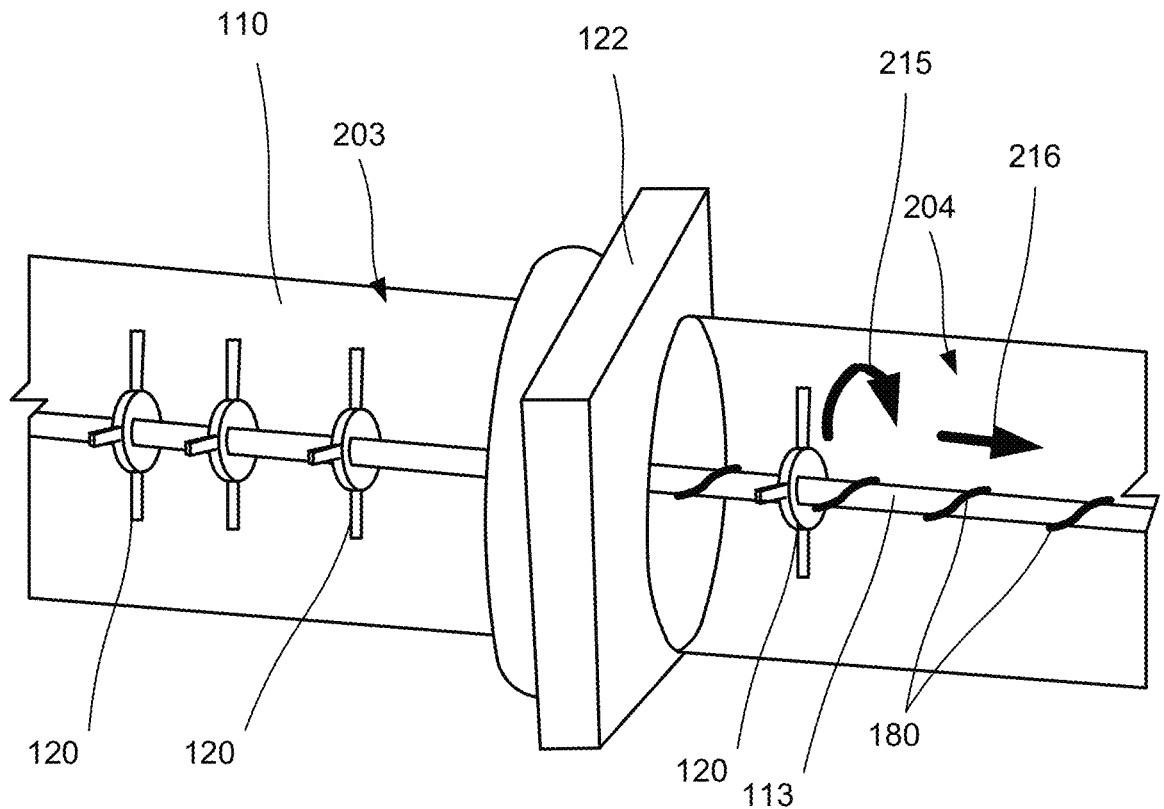
FIG. 3 depicts a schematic diagram of a plasma enhanced chemical vapor deposition coating system according to one or more embodiments of the present disclosure.

Referring now to FIG. 3, a partial view of a system 100 is shown. As depicted, the carousels 120 are shown as they move along the central electrode 113. As they move, they will rotate about the central axis formed by the central electrode 113. As depicted, a plurality of carousels 120 may inhabit a zone. There are a plurality of carousels 120 in the zone 203. Separating zone 203 and zone 204 is a gate valve 122.

As depicted in FIG. 3, a screw drive 180 interacts with the carousel 120 and mechanically forces the carousel 120 to rotate (see arrow 215) about the central axis while it translates (see arrow 216) along the central axis.

Referring now to FIGS. 4-6, various views of a system 100 are shown that depict a carousel 120 within a deposition chamber 110. While this is a standalone chamber 110, the various components may be part of just one or more zones of an in-line system 100 or may operate with a single zone. Referring to FIG. 4, a perspective view is shown with the components within the deposition chamber shown. In the embodiment, the carousel 120 would rotate about the central axis (formed by electrode 113). It may move translationally along the axis or may be stationary in that direction during rotation. The carriers 140 will remain upright similar to what was discussed above in FIGS. 1 and 2.

Referring to FIG. 5, another perspective view of the deposition chamber 110 is shown including more components that may include a plasma generator and other components that are capable of generating a coating that is enhanced by plasma.

Referring to FIG. 6, another perspective view of a deposition chamber is shown. In the illustrated embodiment, a plasma generator 305 is shown. The plasma generator 305 generates a plasma that is then funneled through the central shaft and distributed radially out towards the components that would be in the carriers 140.

Figure 7:
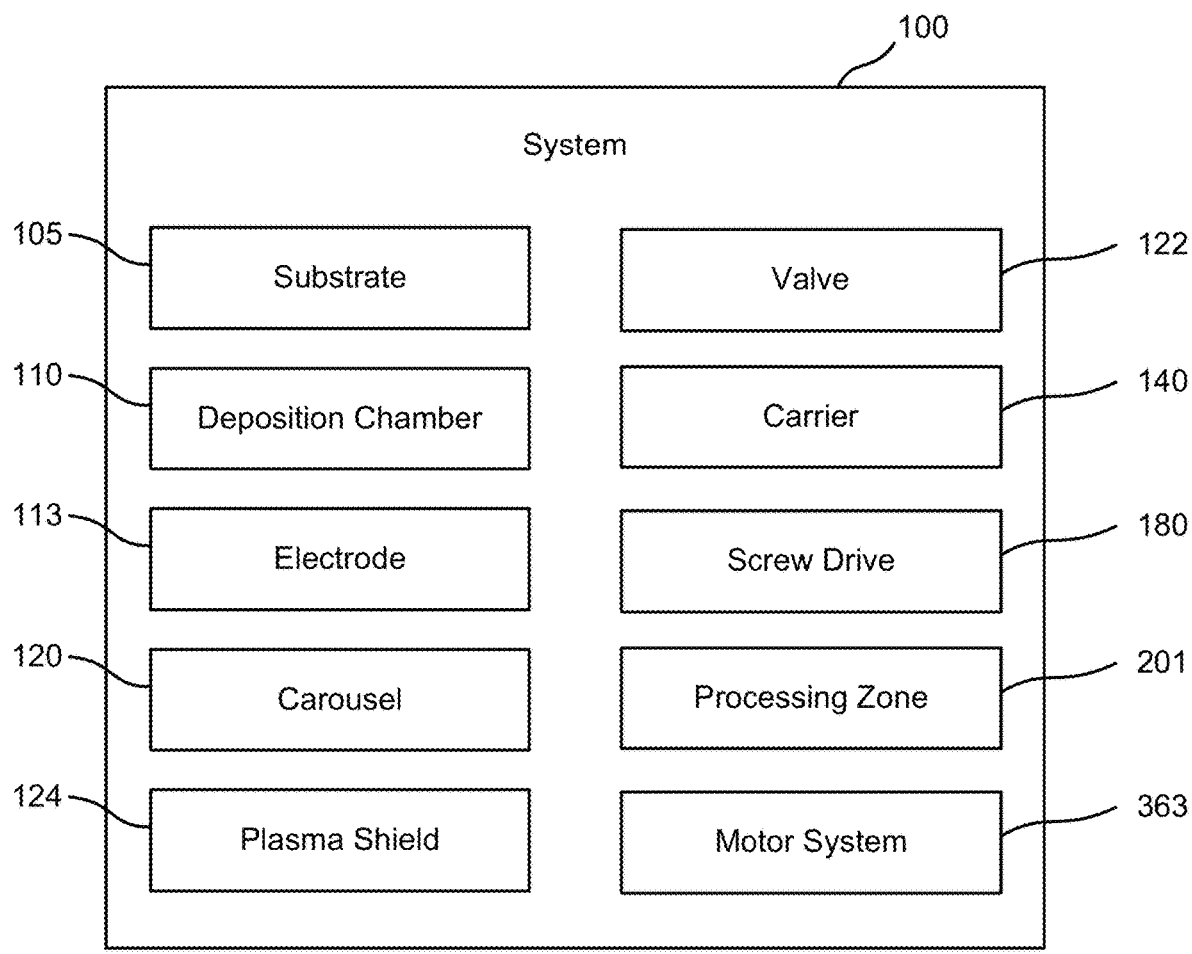
FIG. 7 depicts a schematic diagram of a plasma enhanced chemical vapor deposition coating system according to one or more embodiments of the present disclosure.

Referring now to FIG. 7, a schematic diagram of a system 100 is shown. Although the system 100 is shown and described with certain components, modules and functionality, other embodiments of the system 100 may include fewer or more components or modules to implement less or more functionality.

The system 100 includes various components that have been discussed in more detail throughout the description. Not all embodiments will include each and every feature. Each combination of features is not expressly delineated in this description for the sake of brevity. Such discussion of these features is not repeated herein specifically with FIG. 7 but each of these components may include the features and benefits described in conjunction with the other Figures and the other general description herein.

Various methods of use and manufacture are contemplated herein as well.

Figure 8:
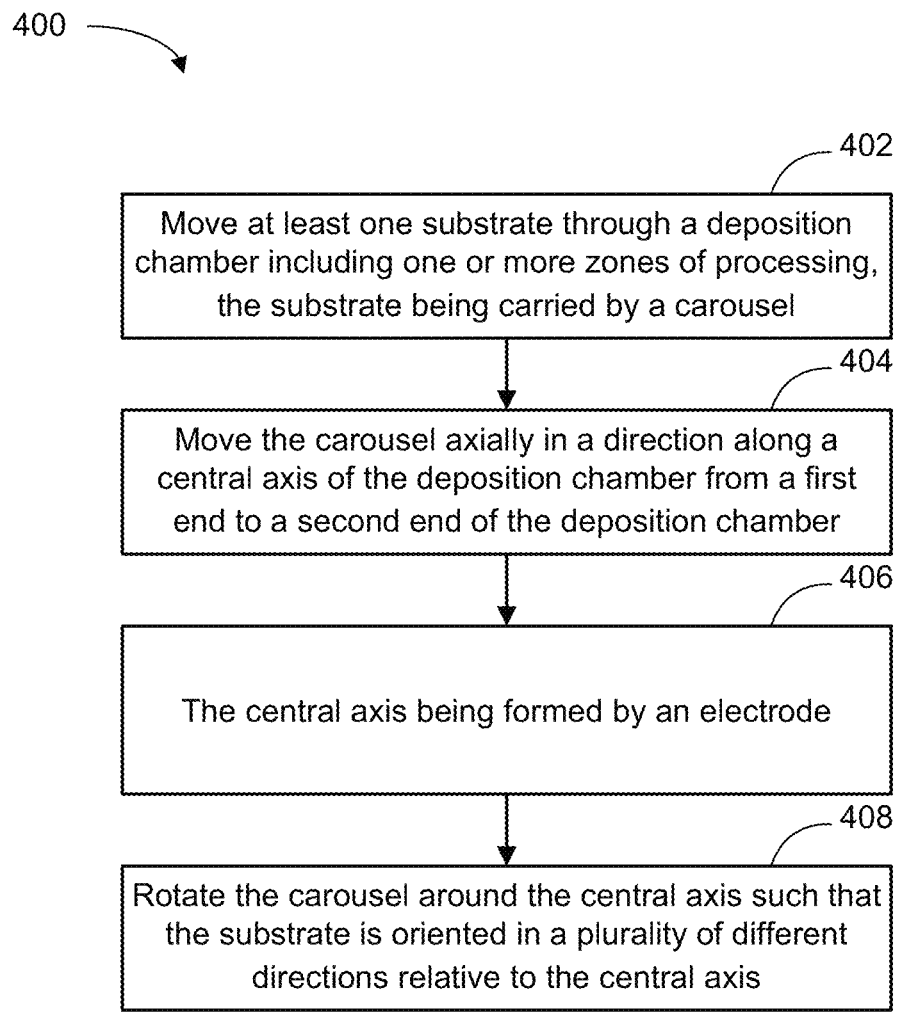
FIG. 8 depicts a schematic block diagram of a method for plasma-enhanced chemical vapor deposition coating according to one or more embodiments of the present disclosure.

Referring to FIG. 8, a method 400 for plasma-enhanced chemical vapor deposition coating is disclosed. At block 402, the method 400 includes moving at least one substrate 105 through a deposition chamber 110 including one or more zones of processing, wherein the substrate 105 is carried by a carousel 120. At block 404, the method 400 includes moving the carousel 120 axially in a direction along a central axis of the deposition chamber 110 from a first end of the deposition chamber 110 to a second end of the deposition chamber 110. At block 406, the method 400 includes the central axis being formed by an electrode 113. At block 408, the method 400 includes rotating the carousel 120 around the central axis such that the substrate 105 is oriented in a plurality of different directions relative to the central axis. The method 400 then ends.

In some embodiments, the carousel 120 is configured to rotate at least a full three hundred and sixty degrees around the central axis.

In some embodiments, the carousel 120 is configured to move axially along the central axis at least partially concurrently while the carousel 120 rotates around the central axis.

In some embodiments, the deposition chamber 110 includes two or more zones of processing.

In some embodiments, a first zone of the two or more zones of processing is a plasma zone, and a second zone of the two or more zones of processing is a post-plasma zone.

In some embodiments, the deposition chamber 110 includes a plasma shield 124 between the first zone of the two or more zones of processing and the second zone of the two or more zones of processing.

In some embodiments, the carousel 120 includes more than one carrier 140 distributed around the central axis.

In some embodiments, the carrier 140 is configured to remain oriented vertically with respect to a ground while the carrier 140 rotates around the central axis.

In some embodiments, the carousel 120 includes a carrier 140 and wherein the carrier 140 is configured to move in a general corkscrew direction around and along the central axis as the carrier 140 moves from the first end to the second end.

Although the operations of the method(s) or processes herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

It should also be noted that at least some of the operations for the methods or processes described herein may be implemented using software instructions stored on a computer useable storage medium for execution by a computer. As an example, an embodiment of a computer program product includes a computer useable storage medium to store a computer readable program or set of instructions that, when executed on a computer, causes the computer to perform operations, including the operations that may be carried out by the controllers or control processors described in conjunction with FIG. 1. In one embodiment, a non-transitory computer-readable medium is configured to store code, software, and/or program instructions that, when executed on one or more processors, control a plasma ashing process and apparatus. This code, software and/or program instructions may include the method steps, processes, functions, features, aspects and algorithms described herein.

Furthermore, embodiments of the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The terms "processor", "control processor", or "controller", may be used interchangeably throughout. These may utilize computer-useable or computer-readable medium to implement functions described herein. The computer-useable or computer-readable medium can be an electronic, magnetic, optical, electromagnetic, infrared, or semiconductor system (or apparatus or device), or a propagation medium. Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Input/output or I/O devices (including but not limited to keyboards, displays, pointing devices, etc.) can be coupled to the system either directly or through intervening I/O controllers. Additionally, network adapters also may be coupled to the system to enable the data processing system to become coupled to other data processing systems or remote printers or storage devices through intervening private or public networks. Modems, cable modems, and Ethernet cards are just a few of the currently available types of network adapters.

What is claimed is:

1. A plasma-enhanced chemical vapor deposition coating system, the system comprising:
   a deposition chamber including one or more spatial zones of processing;
   an electrode centrally located within the deposition chamber, wherein the electrode forms a central axis in the deposition chamber,
   a carousel configured to carry at least one substrate,
   wherein the carousel is configured to move axially in a direction along the central axis from a first end of the deposition chamber to a second end of the deposition chamber,
   wherein the carousel is further configured to rotate around the central axis such that the substrate is oriented in a plurality of different directions relative to the central axis; and
   a cylindrical screw drive that mechanically forces the carousel to rotate around the central axis as the carousel moves axially along the central axis.

2. The plasma-enhanced chemical vapor deposition coating system of claim 1, wherein the carousel is configured to rotate at least a full three hundred and sixty degrees around the central axis.

3. The plasma-enhanced chemical vapor deposition coating system of claim 1, wherein the one or more spatial zones of the deposition chamber includes two or more spatial zones of processing.

4. The plasma-enhanced chemical vapor deposition coating system of claim 3, wherein a first zone of the two or more spatial zones of processing is a plasma zone, and wherein a second zone of the two or more spatial zones of processing is a post-plasma zone.

5. The plasma-enhanced chemical vapor deposition coating system of claim 4, wherein the system further comprises a plasma shield allowing concurrent different plasma processes between the first zone of the two or more zones of processing and the second zone of the two or more zones of processing.

6. The plasma-enhanced chemical vapor deposition coating system of claim 1, wherein the carousel comprises more than one carrier distributed around the central axis.

7. The plasma-enhanced chemical vapor deposition coating system of claim 6, wherein the carrier is configured to remain oriented vertically with respect to a ground while the carrier rotates around the central axis, wherein a top face of the at least one substrate and a bottom face of the at least one substrate which is held by the more than one carrier will both be exposed to the central axis after a full rotation around the central axis.

8. The plasma-enhanced chemical vapor deposition coating system of claim 1, wherein the carousel comprises a carrier and wherein the carrier is configured to move in a general corkscrew direction around and along the central axis as the carrier moves from the first end to the second end.

9. The plasma-enhanced chemical vapor deposition coating system of claim 1, wherein the electrode is a floating electrode.

10. The plasma-enhanced chemical vapor deposition coating system of claim 1, wherein the electrode is an active electrode and the deposition chamber is a ground electrode.

11. The plasma-enhanced chemical vapor deposition coating system of claim 1, further comprising a carrier, wherein parts of the carrier are the electrode and the deposition chamber is a ground electrode.

12. The plasma-enhanced chemical vapor deposition coating system of claim 1, wherein the deposition chamber is lined with an insulating material to aid in cleaning.

13. The plasma-enhanced chemical vapor deposition coating system of claim 1, wherein the deposition chamber is made from or lined with an insulating material and an outer surface of the chamber is a second electrode.

\* \* \* \* \*